United States Patent
Yamauchi et al.

(10) Patent No.: US 8,110,767 B2
(45) Date of Patent: Feb. 7, 2012

(54) STRUCTURED TOUCH SWITCH

(75) Inventors: Kazuto Yamauchi, Okazaki (JP);
Yasunori Murayama, Ichinomiya (JP);
Sadahiko Tanaka, Okazaki (JP);
Keitaro Takizawa, Okazaki (JP);
Kouichi Yamanoue, Yokohama (JP)

(73) Assignees: Mitsubishi Jidosha Kogyo Kabushiki Kaisha, Tokyo (JP); Visteon Japan, Ltd., Yokohama-Shi, Kanagawa (JP)

( * ) Notice: Subject to any disclaimer, the term of this patent is extended or adjusted under 35 U.S.C. 154(b) by 298 days.

(21) Appl. No.: 12/155,627

(22) Filed: Jun. 6, 2008

(65) Prior Publication Data

US 2008/0302649 A1    Dec. 11, 2008

(30) Foreign Application Priority Data

Jun. 11, 2007  (JP) .................. 2007-154445

(51) Int. Cl.
*H03K 17/975*   (2006.01)

(52) U.S. Cl. ..................................... 200/600

(58) Field of Classification Search .................. 200/600
See application file for complete search history.

(56) References Cited

U.S. PATENT DOCUMENTS

| | | | |
|---|---|---|---|
| 4,045,629 A | 8/1977 | Anzani | |
| 4,380,040 A * | 4/1983 | Posset | ........................... 200/600 |
| 4,394,643 A | 7/1983 | Williams | |
| 5,917,165 A | 6/1999 | Platt et al. | |
| 6,483,054 B2 * | 11/2002 | Suzuki et al. | ............... 200/61.44 |
| 6,664,489 B2 | 12/2003 | Kleinhans et al. | |
| 7,075,024 B2 * | 7/2006 | Maeda et al. | .................. 200/310 |
| D561,077 S * | 2/2008 | Kato | ............................ D12/192 |
| 7,626,148 B2 | 12/2009 | Ito | |
| 7,851,720 B2 * | 12/2010 | Raunig | ......................... 200/600 |
| 2006/0207867 A1 | 9/2006 | Waddington | |
| 2007/0095643 A1 | 5/2007 | Weiss et al. | |

FOREIGN PATENT DOCUMENTS

| | | |
|---|---|---|
| DE | 201 19 700 U1 | 3/2002 |
| EP | 1 257 057 A1 | 11/2002 |
| JP | 3-225719 A | 10/1991 |
| JP | 7-73790 A | 3/1995 |
| JP | 9-97525 A | 4/1997 |
| JP | 10-50172 A | 2/1998 |
| JP | 2004-22356 A | 1/2004 |
| JP | 2006-196395 A | 7/2006 |
| JP | 2007-35334 A | 2/2007 |
| KR | 10-2004-0037750 A | 5/2004 |
| WO | WO 2006/043424 A1 | 4/2006 |

* cited by examiner

*Primary Examiner* — Elvin G Enad
*Assistant Examiner* — Lisa Klaus
(74) *Attorney, Agent, or Firm* — Birch, Stewart, Kolasch & Birch, LLP

(57) ABSTRACT

A structured touch switch, which is of an electrostatic capacitance, type is provided. The structured touch switch comprises a substrate made of a material having a non-conductive characteristic, a conductive member made of a material having a conductive characteristic and formed integrally with the substrate so that a portion of the conductive characteristic member appears at a surface of the substrate and a detection electrode positioned at a backside of the substrate and in opposed relation to the conductive member in a state where a space is defined with respect to the conductive member.

13 Claims, 1 Drawing Sheet

STRUCTURED TOUCH SWITCH

BACKGROUND OF THE INVENTION (1) Field of the Invention

The present invention relates to a configuration of an electrostatic capacitance type touch switch designed to detect a touch operation of an operator on the basis of a variation of the electrostatic capacitance between electrodes, and more particularly to a configuration of a touch switch suitable for use in a control panel for devices in the interior of an automobile.

(2) Description of the Related Art

So far, there has been widely known a touch switch designed to, when a portion of a human body comes into contact with or comes close to a conductive electrode member, detect this state for placing a desired device into operation. In the case of such a touch switch, the electrode member functions as an electrostatic capacitance sensor so as to read a variation in impedance (electrostatic capacitance) of the electrode when the human body comes into contact with the electrode, thereby detecting the on/off-state of the touch switch. In general, the electrode member is made of a metallic plate as disclosed, for example, in Japanese Patent Laid-Open No. 2004-22356 (JP 2004-22356).

Moreover, as such an electrostatic capacitance type touch switch, there has been known a type configured by forming electrodes, connection patterns (wiring parts), conductive thin films and others by use of a sputtering technique, a type configured by forming electrodes, connection patterns (wiring parts), conductive thin films and others on a substrate by use of a conductive ink according to a screen printing technique, or other types.

Meanwhile, in the recent years, there has been proposed an idea in which such a touch switch is used in a control panel for devices in the interior of an automobile. Concretely, it is considered to apply it as an on/off switch for an audio device, air conditioner or change-over switch among various modes in an automobile.

With respect to the application to such an automobile control panel, Japanese Patent Laid-Open No. 2006-196395 (JP 2006-196395) discloses a technique in which, when an electrode member is made from an optical non-transparent member, this electrode member is configured as a mesh electrode with a mesh shape in consideration of the operability at night. This configuration allows the transmission of illumination light from a light-emitting device placed in confronting relation to the electrode and enables the compatibility between the illumination light transmission function, although it is made of a non-transparent material, and the function as the electrode member.

In addition, Japanese Patent Laid-Open No. 2007-35334 (JP 2007-35334) discloses a touch switch in which a panel can be shaped freely into a curved surface such as a three-dimensional configuration. Concretely, this document discloses a technique in which a conductive rubber is placed at a backside of a non-conductive panel so that an impedance variation at an touching operation by an operator is transferred through this conductive rubber to an electrode.

However, in the case of a control panel in which a large number of control switches are put on a panel surface, such as an automobile control panel, a configuration using metallic-plate electrodes disclosed in JP 2004-22356 requires that many metallic plates are incorporated into a rear side of a resin-made panel, which leads to a poor assembling workability.

Furthermore, in the case of the technique disclosed in the Patent Document JP 2006-196395, wherein an optical non-transparent mesh electrode is printed onto a rear surface of a resin sheet and the resin sheet is then attached onto a surface of a resin panel, the assembling workability enhances, whereas there is a need to carry out the printing onto a resin sheet and the formation into a three-dimensional configuration, which causes an increase in cost.

Still furthermore, in the case of the technique disclosed in JP 2007-35334, a conductive member (conductive rubber) does not exist on a panel surface and, since the variation of impedance of the conductive rubber is detected through the panel at the touching operation, the detection sensitivity is low and there is possibility that difficulty is experienced in accurately detecting the touching operation. In this case, although it is considered to enhance the detection sensitivity by increasing the electrical output of a detection circuit, an increase in noise occurs and, in a case in which a plurality of touch switches are disposed around it, there is a possibility that an erroneous detection of the touching operation occurs (for example, a judgment is made at the touching operation as a touching operation of an adjacent touch switch).

SUMMARY OF THE INVENTION

The present invention has been developed in consideration of these problems, and it is therefore an object of the invention to provide a configuration of a high-accuracy, low-cost touch switch excellent in assembling workability without incorporating a large number of metallic electrodes into a control panel carrying a plurality of switches.

For this purpose, a touch switch according to the present invention is of an electrostatic capacitance type designed to detect a touch operation on the basis of a variation in electrostatic capacitance between electrodes and is composed of a substrate made of a material having a non-conductive characteristic, a conductive member made of a material having a conductive characteristic and formed integrally with the substrate so that a portion of the conductive member appears at a surface of the substrate and a touch detection electrode positioned at a backside of the substrate and in opposed relation to the conductive member in a state where a space is defined with respect to the conductive member.

In this case, preferably, a light-emitting device is provided on a circuit board holding the detection electrode, and a substrate-side surface of the conductive member is made to allow the transmission of irradiated light from the light-emitting device.

In addition, preferably, a wall section is formed on the conductive member to surround the light-emitting device so that the wall section shields the irradiated light from the light-emitting device.

Still additionally, preferably, the substrate is made of a non-conductive resin while the conductive member is made of a conductive resin.

A configuration of a touch switch according to the present invention is made such that a space is defined between the detection electrode for the touch detection, provided at a backside of the substrate, and the conductive member, which eliminates the need for the strict dimension management in comparison with a case in which a detection electrode and a conductive member are electrically connected with each other, thereby achieving the improvement of the assembling workability and the reduction of cost.

Moreover, since the substrate and the conductive member are formed integrally with each other so that a portion of the conductive member appears at a surface of the substrate, the touch operation by an operator is reliably detectable, which enhances the detection accuracy. Still moreover, the erroneous detection is reducible, which enables the touch switch according to the present invention to be applied to a control panel on which a plurality of switches exist.

In addition, since the substrate side surface of the conductive member is made to allow the transmission of the irradiated light from the light-emitting device, there is an advantage of improving the visibility at night. Still additionally, in a case in which the present invention is applied to a control panel of an automobile, there is an advantage that the improvement of the visibility improves the safety.

Yet additionally, since a light-shielding wall section is formed so as to surround the light-emitting device, it is possible to avoid the leakage of the irradiated light toward other switches.

Furthermore, since both the substrate and the conductive member are made of resins, the two resins having different characteristics can be formed integrally with each other by means of insert molding, two-material molding or the like, which leads to further reduction of cost.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE INVENTION

Figure 1A:
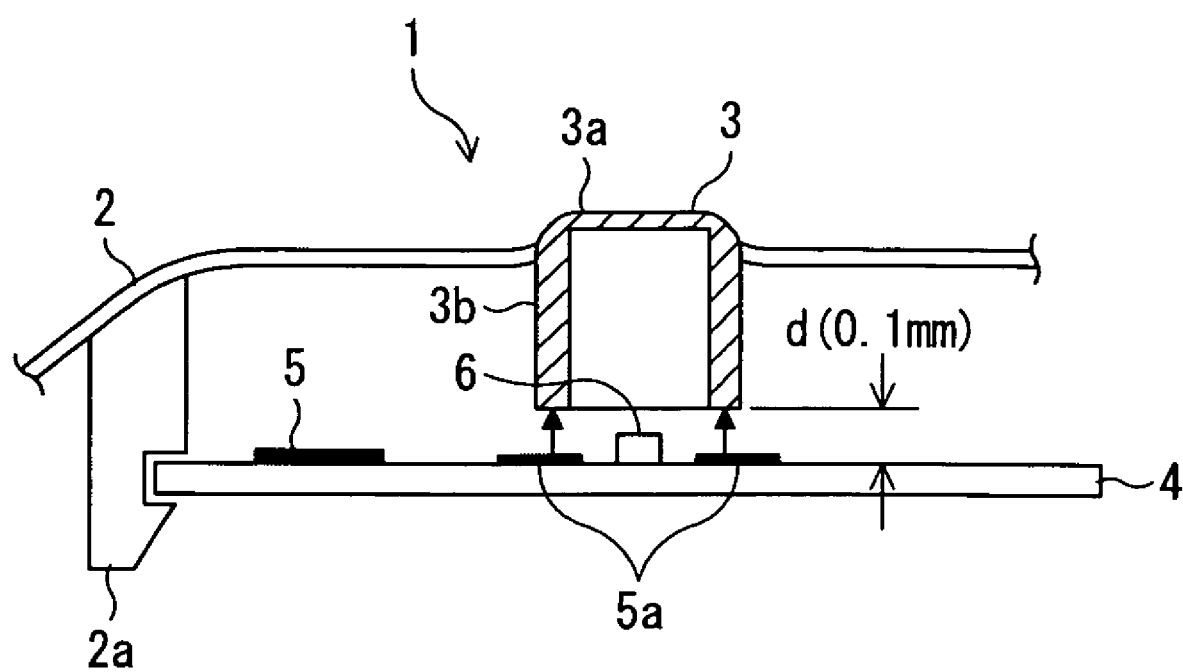
FIG. 1a is a longitudinal cross-sectional view illustratively showing a configuration of a touch switch according to an embodiment of the present invention.
Figure 1B:
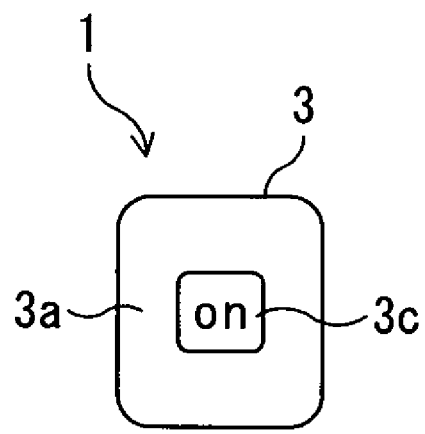
FIG. 1b is a top view illustratively showing a configuration of a touch switch according to an embodiment of the present invention.

With reference to the drawings, a description will be given hereinbelow of a configuration of a touch switch according to an embodiment of the present invention. FIG. 1a is a cross-sectional view illustratively showing a configuration of an essential part of the touch switch, and FIG. 1b is a top view illustratively showing the configuration thereof.

In this embodiment, the touch switch 1 shown in FIG. 1a is provided in the interior of an automobile and is a switch mainly made in an instrument panel for audio equipment or air conditioner. A substrate 2 of the touch switch 1 is made of a milk-white ABS resin to have a sheet-like shape. Owing to the formation of the substrate 2 into the thin sheet-like shape, the touch switch 1 can be formed into a complicated curved-surface shape according to a shape of an instrument panel. Moreover, the front surface side (upper surface side in the illustration) of this substrate 2 is formed as a designed surface exposed to the interior of the automobile while a plurality of reinforcing ribs (not shown) are made on the rear side non-designed surface of the substrate 2.

Although in this embodiment the ABS resin is used as the substrate 2, it is also acceptable to use a different resin such as polypropylene, polycarbonate or acrylic. Moreover, with respect to the color thereof, the present invention is not limited to the milk-white. Still moreover, although in this embodiment the substrate 2 is made of a resin, for the formation of the substrate 2, any material having a non-conductive characteristic is also acceptable, and the material of the substrate 2 is not limited to a resin.

In addition, as illustrated, a conductive member 3 for the touch detection is formed integrally with the substrate 2 by means of the insert molding or two-material molding. In this case, the conductive member 3 functions as a main unit of the switch and, when an operator touches this conductive member (which will be referred to hereinafter as a switch main unit) 3, an operation state of a device connected to the touch switch changes over. Still additionally, the switch main unit 3 is made of a resin material having a conductive characteristic and, concretely, it is made of a so-called conductive polymer having a chemical constitution enabling the electronic transition, a conductive resin composition made by incorporating a chemical compound or metallic grinding, such as interfacial action agent or electrolyte, or conductive filler including carbon, or other materials.

Furthermore, the switch main unit 3 is composed of a top surface section (touch surface) 3a with which an operator comes directly into contact as illustrated and a wall section 3b extending from this top surface section 3a toward the back side. Still furthermore, the top surface section 3a of the switch main unit 3 is formed to be exposed on the front side of the substrate 2 (automobile interior side) and, as shown in FIG. 1b, a character(s) 3c, symbol mark(s) or the like indicating a touch switch function is drawn on a top surface of the switch main unit 3 through the use of a treatment such as the laser etching or two-material molding using a milk-white material.

In addition, on a circuit board 4, which will be mentioned later, an LED (light-emitting device) 6 for illumination is provided at a position confronting the top surface section 3a between the circuit board 4 and the top surface section 3a, and the top surface section 3a is made to allow the transmission of light from the LED 6 at the light emission of the LED 6. In this embodiment, the thickness of the top surface section 3a is set so as to permit the transmission of light from the LED 6, thereby ensuring the permeability.

Still additionally, the wall section 3b is formed along the shape of an edge portion of the top surface section 3a and, in this embodiment, it is made as a square column or pole formed to extend toward the backside of the touch switch 1.

On the other hand, as illustrated, the circuit board 4 is provided at the backside of the substrate 2, and an electrostatic capacitance detection circuit (pattern) 5 having a touch operation detection electrode 5a is printed onto this circuit board 4. Moreover, this circuit board 4 is engaged with and set in a claw portion(s) 2a extending from the substrate 2 toward the back side of the panel as illustrated. Incidentally, although in the illustration the claw portion 2a is set at only a single point, such a claw portion 2a is provided at a plurality of points so that the circuit board 4 can be fixedly secured to the substrate 2.

The detection electrode 5a, formed on the circuit board 4, is disposed at a position confronting a rear side end surface of the wall section 3b of the switch main unit 3 to be spaced by d from the rear-side-end surface thereof. In this case, the space d is set at a given dimension so that, when an operator comes into contact with the switch main unit 3, a variation of the impedance is detectable. Although depending on an electrical output of the circuit 5, in consideration of the prevention of the erroneous touch detection, the assembling workability of the circuit board 4 with the substrate 2, the management of the dimension tolerance of the space, it is preferable that the dimension whereby the impedance variation is detectable is set to be not more than 0.1 mm. In this case, it is also acceptable that the wall section 3b is brought into contact with the detection electrode 5a (that is, d=0).

In general, in the case of a conductive switch main unit 3, a dielectric body including an operator (human body) comes closer to the switch main unit 3, a variation of the electrostatic capacitance increases and, at the touch of the switch main unit 3, the electrostatic capacitance variation reaches a maximum.

On the other hand, in this embodiment, since a small or minute space of approximately 0.1 mm is defined between the wall section 3b and the circuit board 4, the electrostatic capacitance variation occurring due to a touch by the operator is detected without making an electrical connection between the switch main unit 3 and the circuit board 4. Moreover, this produces an output of a touch detection signal from the electrostatic capacitance detection circuit 5. In the state of a small space of approximately 0.1 mm, the touch operation by the operator is detectable at the detection electrode 5a, and a degradation of the detection accuracy does not occur.

Although the above-mentioned Japanese Patent Laid-Open No. 2007-35334discloses a configuration in which a conductive member is provided between a detection electrode and a non-conductive panel, since the conductive member is not exposed at a touch surface, there is a problem in which the touch detection sensitivity decreases. Moreover, in a case in which the output of a circuit 5 is enhanced in order to increase the sensitivity, an erroneous detection can occur because of the pickup of noise.

On the other hand, according to this embodiment, since the substrate 2, having a non-conductive characteristic, and the switch main unit 3, having a conductive characteristic, are integrated with each other by means of the two-material molding to the substrate 2 so that the top surface section 3a of the switch main unit 3 shows up above a surface of the substrate 2, it is possible to realize a touch switch excellent in design while achieving a reliable touch detection.

In addition, a gap is made between the detection electrode 5a and the wall section 3b of the switch main unit 3, which improves the assembling workability and facilitates the management of the dimension tolerance. That is, hypothetically, in a case in which the wall section 3b and the detection electrode 5a are brought into contact with each other so as to establish an electrical connection state, since the dimension tolerances of the switch main unit 3, the circuit board 4 and the substrate 2 are added up, there is a need to accomplish a very strict management of the manufacturing accuracy, which leads to an increase in cost.

On the other hand, according to this embodiment, the formation of a gap of approximately 0.1 mm eliminates the need for the strict management of the dimension tolerance, which enables the cost reduction.

Meanwhile, as mentioned above, the LED 6 is mounted on this circuit board 4. This LED 6 works with an illumination switch of an automobile and lights up in a state linked to the lighting of the headlight. This improves the visibility of the touch switch 1 at night.

Furthermore, as illustrated, the wall section 3b of the switch main unit 3 is made to have a shape surrounding the LED 6. That is, as mentioned above, the wall section 3b has a shape of a square column, and the positional relationship between the LED 6 and the switch main unit 3 is set so that the LED 6 is positioned inside of this square column.

In this case, the wall section 3b has a thickness set so as to shield the irradiated light from the LED 6; thus, functions as a shielding wall. That is, the leakage of light from the LED 6 makes the illumination blurry at night, which may lower the visibility or hurt the outward appearance. For this reason, in order to prevent the transmission of light to parts where the light is unnecessary, the thickness of the wall section 3b is set at a given value so as to inhibit the light from passing through it. Thus, the irradiated light from the LED 6 is applied toward only the top surface section 3a, which can reliably light the switch top surface section 3a even at night.

The structured touch switch according to the embodiment of the present invention, configured as described above, can provide the following effects and advantages.

The detection electrode 5a of the electrostatic capacitance detection circuit 5, mounted on the circuit board 4, confronts the wall section 3b of the switch main unit 3, made of a conductive resin, in a state spaced by a minute distance d, and it establishes the electrostatic coupling. Accordingly, when an operator touches the switch main unit 3, a variation of the electrostatic capacitance of the switch main unit 3, which occurs due to the touch by the operator, is transferred through the detection electrode 5a to the electrostatic capacitance detection circuit 5 and then output as a touch operation signal.

In addition, as described above, in this touch switch 1, since the switch main unit 3 is formed with a conductive member and a portion thereof is made to appear at the substrate 2 so that the top surface section 3a functions as a touch surface, the touch detection can be made with high accuracy. This can eliminate the need for the enhancement of the electrical output of the electrostatic capacitance detection circuit 5, which enables the suppression of the occurrence of noise, thereby allowing this touch switch 1 to be employed for a control panel (particularly, an instrument panel of an automobile) on which a plurality of (or a large number of) switches are in an adjoining condition.

Still additionally, since the irradiated light from the LED 6, mounted on the circuit board 4, is intercepted by the wall section 3b, it is possible to prevent the irradiation to parts where light is unnecessary. In this connection, since a conductive resin usually contains carbon and has an optical non-transparent characteristic, the wall section 3b can easily acquire a light interception characteristic when it is formed to have an appropriate thickness.

Yet additionally, when the top surface section 3a of the switch main unit 3 is formed to get as thin as is light penetrated, the irradiated light from the LED 6 penetrates the top surface section 3a at lighting so as to enable a character (or a symbol mark) made on the top surface section 3a to come up and appear, which improves the visibility at night.

Moreover, a space d, defined between the detection electrode 5a of the electrostatic capacitance detection circuit 5 and the wall section 3b of the switch main unit 3, facilitates the dimension management and achieves the cost reduction. Still moreover, the formation of the space d allows the employment of a simple assembling technique in which the circuit board 4 and the panel 2 are attached to each other by means of the engagement with the claw portions 2a of the panel 2, which contributes to further cost reduction.

Yet moreover, in a case in which the substrate 2 is made of a non-conductive resin and the switch main unit 3 is made of a conductive resin, these two members can be formed integrally with each other through the use of the insert molding or two-material molding which has been well known so far, which achieves further cost reduction.

Although a description has been given above of an embodiment of the present invention, the present invention is not limited to the above-described embodiment, and it is intended to cover all changes and modifications of the embodiment of the invention herein which do not constitute departures from the spirit and scope of the invention. For example, the attachment of the circuit board 4 to the substrate 2 is not limited to the engagement with the claw portions, and it is also appropriate that, for example, a boss portion is made vertically on the rear surface side of the substrate 2 and the circuit board may be attached to this boss portion with a screw (vis). In addition, the light-emitting device is not limited to the LED, and various types of light-emitting devices are also employable.

What is claimed is:

1. A structured touch switch which is of an electrostatic capacitance type designed to detect a touch operation based on a variation in electrostatic capacity between electrodes, comprising:
   a substrate made of a material having a non-conductive characteristic;
   a conductive member made of a material having a conductive characteristic and formed integrally with said substrate so that a portion of said conductive characteristic member appears at a surface of said substrate, said conductive member being provided at one side of the substrate;
   a circuit board that opposes and spaced apart from the substrate; and
   a touch detection electrode mounted on the circuit board and provided at said one side of the substrate at a position facing said conductive member in a state, said conductive member and said touch detection electrode defining an open space therebetween,
   wherein said substrate is made of a non-conductive resin while said conductive member is made of a conductive resin.

2. The structured touch switch according to claim 1, wherein a light-emitting device is provided on the circuit board holding said detection electrode, and a substrate side surface of said conductive member is made to allow transmission of light from said light-emitting device.

3. The structured touch switch according to claim 2, wherein a wall section is formed on said conductive member to surround said light-emitting device so that said wall section shields the light from said light-emitting device.

4. The structured touch switch according to claim 1, wherein the substrate is incorporated into a control panel of an automobile, and is formed into a curved shape according to a shape of the control panel.

5. The structured touch switch according to claim 1, wherein said touch detection electrode is set in a portion extending from the circuit board toward said substrate, said portion defining said open space.

6. A structured touch switch which is of an electrostatic capacitance type designed to detect a touch operation based on a variation in electrostatic capacity between electrodes, comprising:
   a substrate made of a material having a non-conductive characteristic;
   a conductive member made of a material having a conductive characteristic and formed integrally with said substrate so that a portion of said conductive characteristic member appears at a surface of said substrate; and
   a touch detection electrode provided at a position directly opposing said conductive member in a state where a space is defined with respect to said conductive member,
   wherein a light-emitting device is provided on a circuit board holding said detection electrode, and a substrate side surface of said conductive member is made to allow transmission of light from said light-emitting device.

7. The structured touch switch according to claim 6, wherein a wall section is formed on said conductive member to surround said light-emitting device so that said wall section shields the light from said light-emitting device.

8. The structured touch switch according to claim 6, wherein the light-emitting device emits the light in conjunction with an illumination switch of an automobile.

9. A structured touch switch which is of an electrostatic capacitance type designed to detect a touch operation based on a variation in electrostatic capacity between electrodes, comprising:
   a substrate made of a material having a non-conductive characteristic;
   a conductive member made of a material having a conductive characteristic and formed integrally with said substrate so that a portion of said conductive characteristic member appears at a surface of said substrate; and
   a touch detection electrode provided at a position directly opposing said conductive member in a state where a space is defined with respect to said conductive member,
   wherein said substrate is made of a non-conductive resin while said conductive member is made of a conductive resin.

10. A structured touch switch which is of an electrostatic capacitance type designed to detect a touch operation based on a variation in electrostatic capacity between electrodes, comprising:
    a substrate made of a material having a non-conductive characteristic;
    a conductive member made of a material having a conductive characteristic and formed integrally with said substrate so that a portion of said conductive characteristic member appears at a surface of said substrate; and
    a touch detection electrode provided at a position directly opposing said conductive member in a state where a space is defined with respect to said conductive member,
    wherein a switch main unit is made of the conductive member, the switch main unit comprising a top surface section and a wall section extending from the top surface section toward a back side,
    wherein the wall section faces the touch detection electrode, so as to establish an electrostatic coupling with the touch detection electrode.

11. A structured touch switch which is of an electrostatic capacitance type designed to detect a touch operation based on a variation in electrostatic capacity between electrodes, comprising:
    a substrate made of a material having a non-conductive characteristic;
    a conductive member made of a material having a conductive characteristic and formed integrally with said substrate so that a portion of said conductive characteristic member appears at a surface of said substrate;
    a touch detection electrode provided at a position directly opposing said conductive member in a state where a space is defined with respect to said conductive member,
    a circuit board provided at a backside of the substrate; and
    a supporting member extending from the substrate and being engaged with the circuit board, so as to define a space between the conductive member and the touch detection electrode.

12. A structured touch switch which is of an electrostatic capacitance type designed to detect a touch operation based on a variation in electrostatic capacity between electrodes, comprising:
    a substrate made of a material having a non-conductive characteristic;
    a conductive member made of a material having a conductive characteristic and formed integrally with said substrate so that a portion of said conductive characteristic member appears at a surface of said substrate, said conductive member being provided at one side of the substrate; and a touch detection electrode provided at said one side of the substrate at a position facing said conductive member in a state, said conductive member and said touch detection electrode defining an open space therebetween, wherein said substrate is made of a non-conductive resin while said conductive member is made of a conductive resin.

13. A structured touch switch which is of an electrostatic capacitance type designed to detect a touch operation based on a variation in electrostatic capacity between electrodes, comprising:

a substrate made of a material having a non-conductive characteristic;

a conductive member made of a material having a conductive characteristic and formed integrally with said substrate so that a portion of said conductive characteristic member appears at a surface of said substrate, said conductive member being provided at one side of the substrate;

a circuit board that opposes and spaced apart from the substrate; and a touch detection electrode mounted on the circuit board and provided at said one side of the substrate at a position facing said conductive member in a state, said conductive member and said touch detection electrode defining an open space therebetween, wherein said substrate is made of a non-conductive resin while said conductive member is made of a conductive resin.

* * * * *